United States Patent
Lee

(10) Patent No.: US 10,917,046 B2
(45) Date of Patent: Feb. 9, 2021

(54) ELECTRONIC CIRCUIT PERFORMING PUSH-PULL OPERATION AND OSCILLATOR INCLUDING THE SAME

(71) Applicant: ELECTRONICS AND TELECOMMUNICATIONS RESEARCH INSTITUTE, Daejeon (KR)

(72) Inventor: Ja Yol Lee, Nonsan-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/600,966

(22) Filed: Oct. 14, 2019

(65) Prior Publication Data

US 2020/0119690 A1 Apr. 16, 2020

(30) Foreign Application Priority Data

Oct. 15, 2018 (KR) .......................... 10-2018-0122867

(51) Int. Cl.
*H03B 5/12* (2006.01)
*H04B 1/40* (2015.01)

(52) U.S. Cl.
CPC ........... *H03B 5/1228* (2013.01); *H03B 5/124* (2013.01); *H03B 5/1215* (2013.01); *H03B 2200/0008* (2013.01); *H04B 1/40* (2013.01)

(58) Field of Classification Search
CPC .. H03B 5/1206; H03B 5/1212; H03B 5/1215; H03B 5/1228; H03B 5/1231; H03B 5/1237; H03B 5/124; H03B 5/1243; H03B 5/1246; H03B 5/125; H03B 5/1253; H03B 2200/0008
See application file for complete search history.

(56) References Cited

U.S. PATENT DOCUMENTS

| | | | |
|---|---|---|---|
| 6,683,507 B2 | 1/2004 | Jeong | |
| 6,750,727 B1* | 6/2004 | Sutardja | H03B 5/1228 330/253 |
| 6,867,658 B1* | 3/2005 | Sibrai | H03B 5/1215 331/117 FE |
| 7,369,005 B2 | 5/2008 | Kasahara | |
| 7,573,338 B2 | 8/2009 | Kim | |
| 7,902,930 B2 | 3/2011 | Lee et al. | |
| 8,242,854 B2* | 8/2012 | Mishra | H03L 7/099 331/117 R |

(Continued)

FOREIGN PATENT DOCUMENTS

| | | |
|---|---|---|
| KR | 10-0551481 B1 | 2/2006 |
| KR | 10-0759508 B1 | 9/2007 |

*Primary Examiner* — Levi Gannon
(74) *Attorney, Agent, or Firm* — Rabin & Berdo, P.C.

(57) ABSTRACT

Provided is an electronic circuit including a resonant circuit configured to output a resonance voltage having a resonance frequency to a first node, and an oscillation circuit configured to output an oscillation voltage having a level changed according to a first current and a second current based on the resonance voltage received from the first node, wherein the first current is delivered between a first voltage supply terminal and a second node in a first time period, the second current is delivered between the second node and a second voltage supply terminal in a second time period, and a sum of a length of the first time period and a length of the second time period corresponds to the resonance frequency.

15 Claims, 14 Drawing Sheets

(56) References Cited

U.S. PATENT DOCUMENTS

| | | | |
|---|---|---|---|
| 8,264,293 B2 | 9/2012 | Yun et al. | |
| 8,415,991 B2* | 4/2013 | Rangarajan | H03K 17/6872 |
| | | | 327/108 |
| 2004/0251975 A1* | 12/2004 | Li | H03B 5/1271 |
| | | | 331/46 |
| 2005/0001691 A1* | 1/2005 | Kim | H03B 5/1243 |
| | | | 331/117 R |
| 2005/0265053 A1* | 12/2005 | Higashi | H03B 27/00 |
| | | | 363/71 |
| 2006/0097801 A1 | 5/2006 | Adan | |
| 2006/0238266 A1 | 10/2006 | Harjani et al. | |
| 2009/0102565 A1* | 4/2009 | Jang | H03B 5/1221 |
| | | | 331/40 |
| 2009/0174493 A1* | 7/2009 | Jeon | H03B 5/1228 |
| | | | 331/181 |
| 2012/0212300 A1* | 8/2012 | Tang | H03B 5/1215 |
| | | | 331/117 FE |
| 2016/0190985 A1* | 6/2016 | Lin | H03B 5/1243 |
| | | | 331/117 FE |
| 2020/0036284 A1* | 1/2020 | Qin | H01F 27/2804 |

* cited by examiner

ELECTRONIC CIRCUIT PERFORMING PUSH-PULL OPERATION AND OSCILLATOR INCLUDING THE SAME

CROSS-REFERENCE TO RELATED APPLICATIONS

This U.S. non-provisional patent application claims priority under 35 U.S.C. § 119 of Korean Patent Application No. 10-2018-0122867, filed on Oct. 15, 2018, the entire contents of which are hereby incorporated by reference.

BACKGROUND

The present disclosure herein relates to an electronic circuit, and more particularly, to a push-pull electronic device and an oscillator including the same.

As a demand for resources of a millimeter-wave frequency band increases, a technology for dealing with millimeter-wave frequencies is being actively developed. A wired or wireless communication system in the millimeter-wave frequency band includes a voltage-controlled oscillator (VCO) for generating a signal of a specific frequency.

The VCO is configured to convert a DC voltage into an AC voltage. Concretely, the VCO is configured to output a signal of a frequency corresponding to an input voltage. If necessary, a communication system using various channels is required to generate signals of various frequencies, and thus includes a VCO.

A VCO includes active elements for providing a negative resistance. When an oscillation condition is satisfied, the VCO may start to oscillate. In order to meet the oscillation condition, the VCO should be designed to have a larger negative resistance than a load resistance connected to an output stage.

SUMMARY

The present disclosure provides an electronic device configured to perform a push-pull operation, and an oscillator including the same.

An embodiment of the inventive concept provides an electronic circuit including a resonant circuit and an oscillation circuit. The resonant circuit may output a resonance voltage having a resonance frequency to a first node. The oscillation circuit may output an oscillation voltage having a level changed according to a first current and a second current based on the resonance voltage received from the first node. The first current may be delivered between a first voltage supply terminal and a second node in a first time period. The second current may be delivered between the second node and a second voltage supply terminal in a second time period. The sum of a length of the first time period and a length of the second time period may correspond to the resonance frequency.

BRIEF DESCRIPTION OF THE FIGURES

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings:

FIG. 6 is a circuit diagram showing an example operation of the oscillator of FIG. 5a;

DETAILED DESCRIPTION

Figure 1:
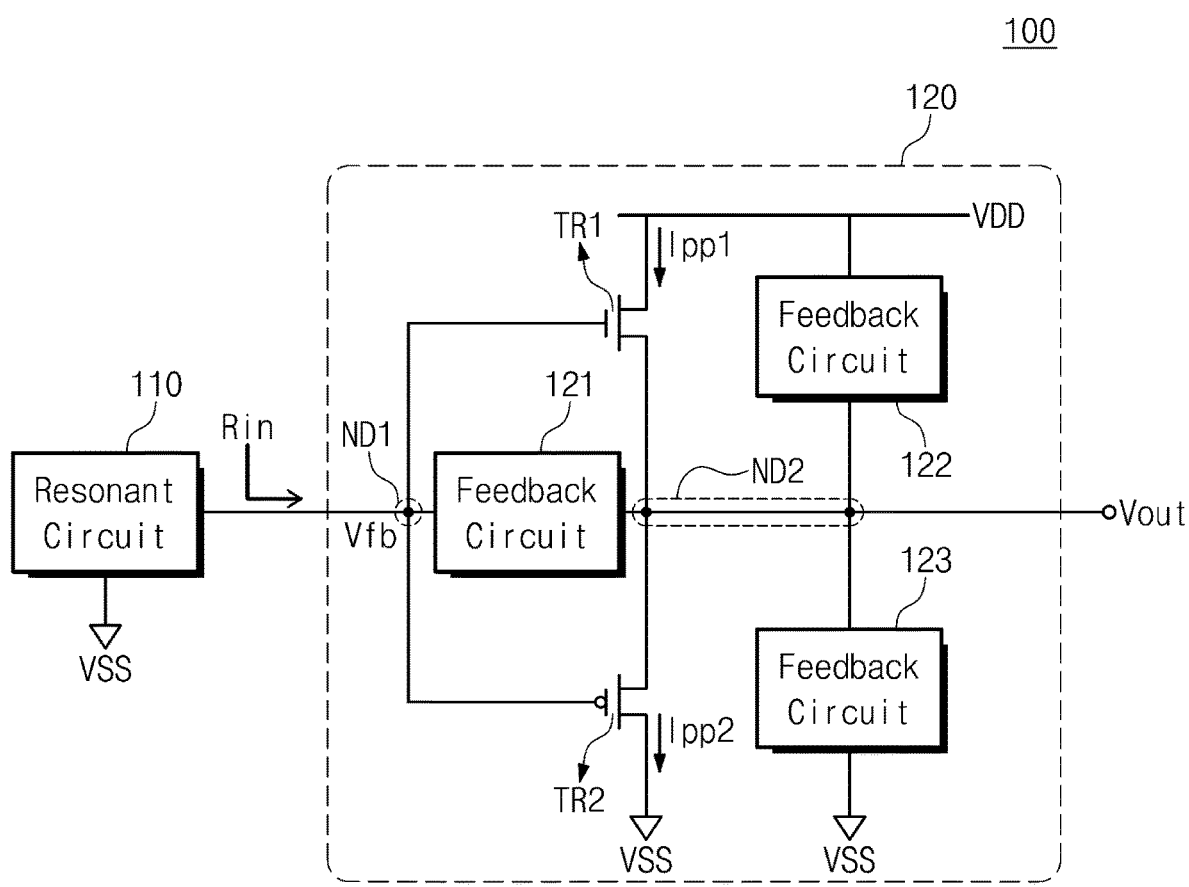
FIG. 1 is a block diagram illustrating a configuration of an oscillator according to an embodiment of the inventive concept.

Hereinafter embodiments of the present inventive concept will be described in detail with reference to the accompanying drawings. In the following description, specific details such as detailed components and structures are provided to assist overall understanding of embodiments of the present disclosure. Therefore, various changes or modifications can be made by those of ordinary skill in the art in the specific details without departing from technical spirit and scope of the present disclosure. In addition, descriptions of well-known functions and constructions may be omitted for clarity and conciseness. Terms used herein are defined in consideration of functions of the present disclosure, and are not limited specific functions. The definitions of the terms can be determined based on details described in the specification.

Circuits in the drawings or the description may be connected to items other than elements shown in the drawings or the description. Circuits or elements can be respectively connected directly or indirectly to each other. Circuits or elements can be respectively connected by communication or physical connection.

Unless defined otherwise, all the terms including technical or scientific terms used herein have the same meaning as those understood generally by a person having an ordinary skill in the art. The terms having the same meaning as those defined in generally used dictionaries shall be construed to have the meaning conforming to the contextual meaning of the related technologies, and shall not be construed as ideal or excessively formal meaning unless the terms are apparently defined in this application.

FIG. 1 is a block diagram illustrating a configuration of an oscillator according to an embodiment of the inventive concept.

Referring to FIG. 1, the oscillator 100 may include a resonant circuit 110 and a push-pull oscillation circuit 120. The push-pull oscillation circuit 120 may include feedback circuits 121 to 123 and transistors TR1 and TR2. Referring to FIG. 1, an embodiment in which the resonant circuit 110, the transistor TR2, and the feedback circuit 123 are connected to a VSS voltage supply terminal is to be described. It would be understood that the resonant circuit 110, the transistor TR2, and the feedback circuit 123 may be connected to one among terminals for supplying voltages of various levels. For example, The level of VSS voltage may be less than 0[V].

Figure 10:
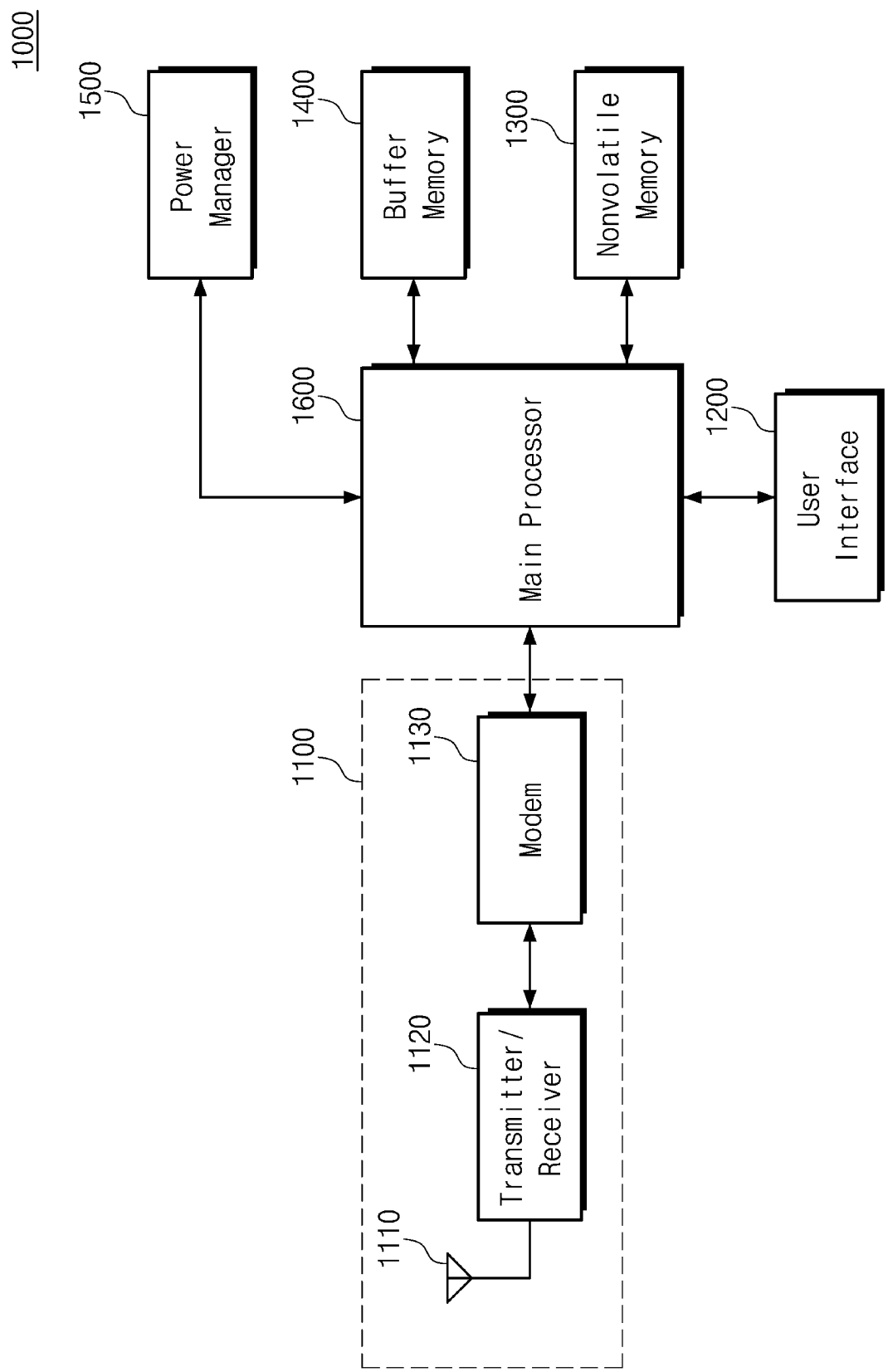
FIG. 10 is a block diagram illustrating an example configuration of an electronic device including the oscillator of FIG. 1.

As to be described in relation to FIG. 10, the oscillator 100 may be an element of an electronic device. For example, the electronic device 100 may be one of a personal computer (PC), a workstation, a notebook computer, a mobile device, or the like. Alternatively, the electronic device may be implemented with a supportable data processing device that may use or support the interface protocol proposed by the MIPI Alliance. For example, the electronic device may be a Personal Digital Assistant (PDA), a Portable Media Player (PMP), a smartphone, a tablet computer, a wearable device, or the like.

For example, the oscillator 100 may be an element of a communication device or the like included in the electronic device. The oscillator 100 may be configured to output a voltage having a frequency determined based on a control (e.g., a control by a designer or other elements included in the electronic device) from the outside of the electronic device.

The resonant circuit 110 may be connected between the VSS voltage supply terminal and a node ND1. The feedback circuit 121 may be connected between the node ND1 and a node ND2. The feedback circuit 122 may be connected between a VDD voltage supply terminal and the node ND2. The feedback circuit 123 may be connected between the node ND2 and the VSS voltage supply terminal. The transistor TR1 may be connected between the VDD voltage supply terminal and the node ND2. A gate terminal of the transistor TR1 may be connected to the node ND1. The transistor TR2 may be connected between the node ND2 and the VSS voltage supply terminal. A gate terminal of the transistor TR2 may be connected to the node ND1.

Each of the transistors TR1 and TR2 may be one among transistors of various types including a Bipolar Junction Transistor (BJT), a Field Effect Transistor (FET), or the like. In the example of FIG. 1, the transistor TR1 may be an n-type Metal Oxide Semiconductor Field Effect Transistor (MOSFET), and the transistor TR2 may be a p-type MOSFET, but the embodiment of the inventive concept is not limited thereto.

The resonant circuit 110 may output a voltage having a resonance frequency. The voltage having the resonance frequency may be formed at the node ND1 by the resonant circuit 110. The resonant circuit 110 may include circuits of various types configured to output a voltage having the resonance frequency. For example, the resonant circuit 110 may include an LC resonant circuit including a capacitive element and an inductive element connected in parallel, but the embodiment of the inventive concept is not limited thereto.

The feedback circuits 121 to 123 may provide feedback paths to the voltage formed at the node ND2. The feedback circuit 121 may feed the voltage of the node ND2 back to the node ND1. The feedback circuit 122 may feed the voltage of the node ND2 back to one terminal of the transistor TR2 through VSS voltage supply terminal. The feedback circuit 123 may feed the voltage of the node ND2 back to one terminal of the transistor TR1 through the VDD voltage supply terminal.

Each of the feedback circuits 121 to 123 may include circuits for providing the feedback path. For example, each of the feedback circuits 121 to 123 may include at least one among a capacitive element, an inductive element, and a resistor connected in parallel to the capacitive and inductive elements in order to provide the feedback paths to the voltage of the node ND2, but the embodiment of the inventive concept is not limited thereto.

When the level of the voltage formed at the node ND1 is equal to or greater than a first reference value, the transistor TR1 may deliver a current Ipp1 from the VDD voltage supply terminal to the node ND2. As the current Ipp1 is delivered to the node ND2, a voltage Vout may be formed at the node ND2. For example, the level of the voltage Vout may be 0 or greater due to the current Ipp1 (a push operation). Since the current Ipp1 is generated based on the voltage VDD, the level of the voltage Vout may be related to the level of the voltage VDD.

When the level of the voltage formed at the node ND1 is equal to or smaller than a second reference value, the transistor TR2 may deliver a current Ipp2 from the node ND2 to the VSS voltage supply terminal. As the current Ipp2 is delivered from the node ND2, the voltage Vout may be formed at the node ND2. For example, the level of the voltage Vout may be 0 or smaller due to the current Ipp2 (a pull operation). Since the current Ipp2 is generated based on the ground voltage, the level of the voltage Vout may be related to the level of the ground voltage. When, not the ground voltage, but a specific voltage supply terminal is connected to the transistor TR2, the level of the voltage Vout may be related to the level of the specific voltage.

The push-pull oscillation circuit 120 may have a negative resistance Rin having the magnitude determined based on the characteristics of the feedback circuits 121 to 123. With respect to a direction viewed from the resonant circuit 110 to the node ND1, the push-pull oscillation circuit 120 may operate as a circuit having the negative resistance Rin. The magnitude of the negative resistance Rin may be determined based on the feedback circuits 121 to 123.

Since the voltage Vout is generated based on a voltage Vfb output from the resonant circuit 110, a frequency of the voltage Vout may correspond to a frequency of the voltage Vfb. As to be described in relation to FIG. 5a, a designer may control the resonant circuit 110 to adjust a resonant frequency of the voltage Vfb. The designer may control the resonant circuit 110 to adjust the frequency of the voltage Vout.

Figure 2:
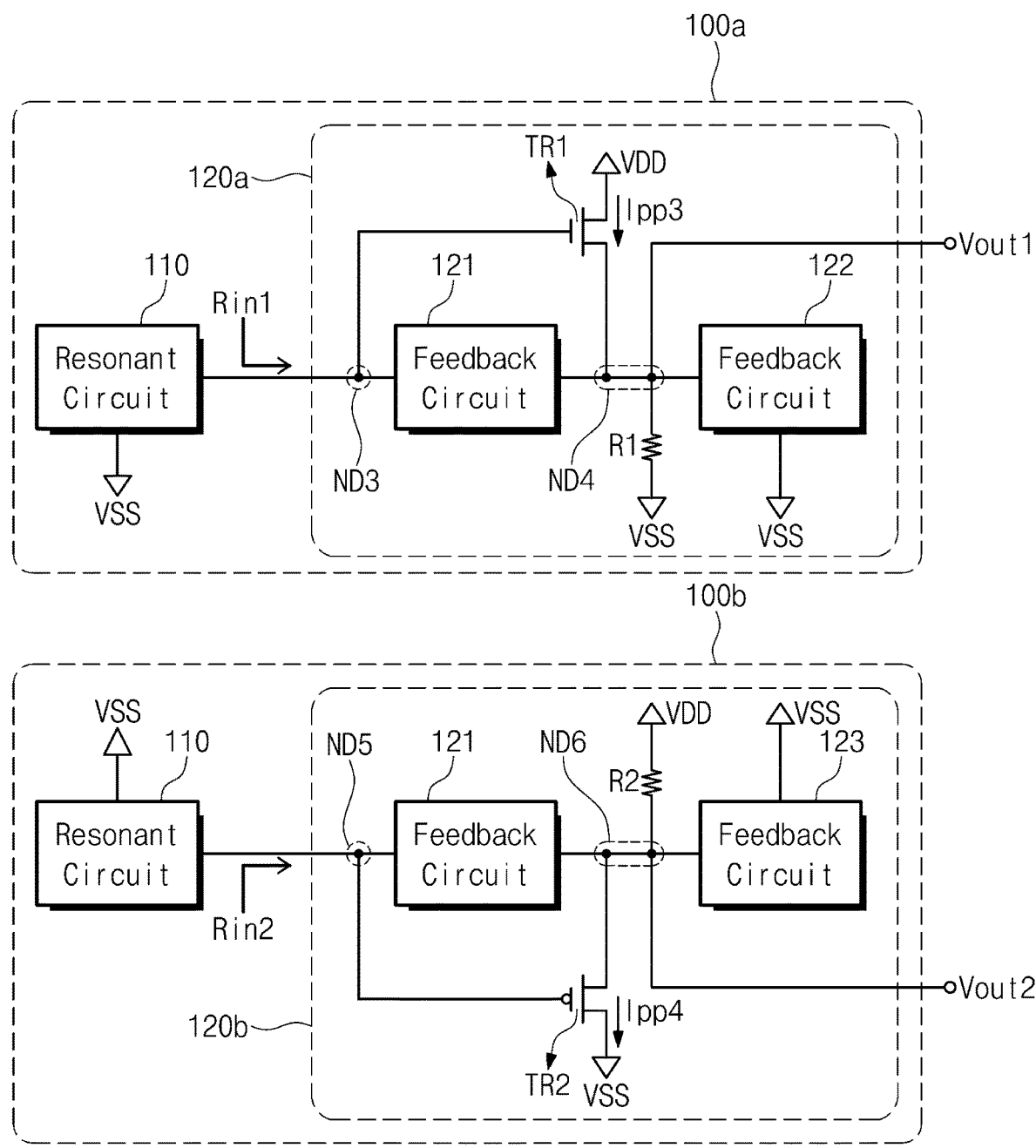
FIG. 2 is a block diagram illustrating configurations of oscillators according to an embodiment of the present disclosure.

FIG. 2 is a block diagram illustrating configurations of oscillators according to an embodiment of the present disclosure.

Operations of oscillators 100a and 100b of FIG. 2 may be related to operations of the oscillator 100 of FIG. 1. For example, the oscillator 100a of FIG. 2 may be related to the push operation of the oscillator 100 of FIG. 1, and the oscillator 100b of FIG. 2 may be related to the pull operation of the oscillator 100 of FIG. 1. The oscillator 100a may include a resonant circuit 110, feedback circuits 121 and 122, a transistor TR1 and a resistor R1. The oscillator 100b may include a resonant circuit 110, feedback circuits 121 and 123, a transistor TR2, and a resistor R2.

In the oscillator 100a, the resonant circuit 110 may be connected between a VSS voltage supply terminal and a node ND3. The feedback circuit 121 may be connected between the node ND3 and a node ND4. The feedback circuit 122 may be connected between the node ND4 and the VSS voltage supply terminal. The resistor R1 may be connected between the node ND4 and a VSS voltage supply terminal. The transistor TR1 may be connected between a VDD voltage supply terminal and the node ND4. A gate terminal of the transistor TR1 may be connected to the node ND3.

In the oscillator 100b, the resonant circuit 110 may be connected between the VSS voltage supply terminal and a node ND5. The feedback circuit 121 may be connected between the node ND5 and a node ND6. The feedback circuit 123 may be connected between the node ND6 and the VSS voltage supply terminal. The resistor R2 may be connected between a node ND6 and the VDD voltage supply terminal. The transistor TR2 may be connected between the VSS voltage supply terminal and the node ND6. A gate terminal of the transistor TR2 may be connected to the node ND5.

In the push-pull oscillation circuit 120 of FIG. 1, a resistance for the direction viewed from the node ND2 to the transistor TR2 and the feedback circuit 123 connected in parallel may correspond to the resistor R1. In the push-pull oscillation circuit 120 of FIG. 1, a resistance for the direction viewed from the node ND2 to the transistor TR1 and the feedback circuit 122 connected in parallel may correspond to the resistor R2.

A voltage Vout1 output from the node ND4 of the oscillator 100a and a voltage Vout2 output from the node ND6 of the oscillator 100b may be related to the voltage Vout output from the oscillator 100 of FIG. 1. For example, the sum of the level of the voltage Vout1 and the level of the voltage Vout2 may correspond to the level of the voltage Vout.

For example, the voltage of the node ND3 is equal to or greater than a first reference value, the transistor TR1 may deliver a current Ipp3 from a VDD voltage supply terminal to the node ND4. As the current Ipp3 is delivered to the node ND4, the voltage Vout1 may be formed at the node ND4. Since the current Ipp3 is generated based on the voltage VDD, the level of the voltage Vout1 may be related to the voltage VDD. For example, as the current Ipp3 flows, the level of the voltage Vout may be 0 or greater. Accordingly, the operation of the oscillator 100a may correspond to the push operation of the oscillator 100.

For example, when the voltage of the node ND5 is equal to or smaller than the second reference value, the transistor TR2 may deliver a current Ipp4 from the node ND6 to the VSS voltage supply terminal. As the current Ipp4 is delivered from the node ND6, the voltage Vout2 may be formed at the node ND4. Since the current Ipp4 is generated based on the ground voltage, the level of the voltage Vout2 may be related to the ground voltage. For example, as the current Ipp4 flows, the level of the voltage Vout may be 0 or smaller. Accordingly, the operation of the oscillator 100b may correspond to the pull operation of the oscillator 100.

Since the operations of the oscillator 100 of FIG. 1 correspond to the operations of the oscillators 100a and 100b of FIG. 2, the level of the voltage Vout may be related to the levels of the voltages Vout1 and Vout2. For example, the level of the voltage Vout may correspond to the sum of the level of the voltage Vout1 and the level of the voltage Vout2.

The oscillation circuit 120a may have a negative resistance Rin1. In other words, with respect to the direction viewed from the resonant circuit 100 to the node ND3, the oscillation circuit 120a may operate as a circuit having the negative resistance Rin1. The magnitude of the negative resistance Rin1 may be related to the feedback circuits 121 and 122. For example, when the feedback circuits 121 and 122 respectively include capacitors, the magnitude of the negative resistance Rin1 may be related to the capacitances of the capacitors.

The push-pull oscillation circuit 120b may have a negative resistance Rin2. In other words, with respect to the direction viewed from the resonant circuit 110 to the node ND5, the oscillation circuit 120b may operate as a circuit having the negative resistance Rin2. The magnitude of the negative resistance Rin2 may be related to the feedback circuits 121 and 123. For example, when the feedback circuits 121 and 123 respectively include capacitors, the magnitude of the negative resistance Rin1 may be related to the capacitances of the capacitors.

In FIGS. 1 and 2, as a synthesis capacitance of the push-pull oscillation circuit 120 and the oscillation circuits 120a and 120b is larger, the negative resistances Rin, Rin1, and Rin2 of the push-pull oscillation circuit 120 and the oscillation circuits 120a and 120b may be large. As the sum of capacitances of feedback circuits connected to a terminal for outputting an oscillated voltage is larger, the synthesis capacitance may be large.

Comparing FIG. 1 with FIG. 2, the push-pull oscillation circuit 120 includes the three feedback circuits 121 to 123, the oscillation circuit 120a includes the two feedback circuits 121 and 122, and the oscillation circuit 120b includes the two feedback circuits 121 and 123. And thus the negative resistance Rin of the push-pull oscillation circuit 120 may be larger than the negative resistances Rin1 and Rin2 of the oscillation circuits 120 and 120b.

With respect to one cycle of a voltage generated by the resonant circuit 110, the oscillation circuits 120a and 120b may perform only one of the push operation and the pull operation of the push-pull oscillation circuit 120. Accordingly, each of the oscillation circuits 120a and 120b may output the oscillated voltage Vout1 or Vout2 during a half cycle of the voltage. However, the push-pull oscillation circuit 120 may output the voltage Vout oscillated during one cycle of the voltage by sequential operations of the transistor TR1 and the transistor TR2. Accordingly, an efficiency of the oscillator 100 may be higher than those of the oscillators 100a and 100b.

Figure 3:
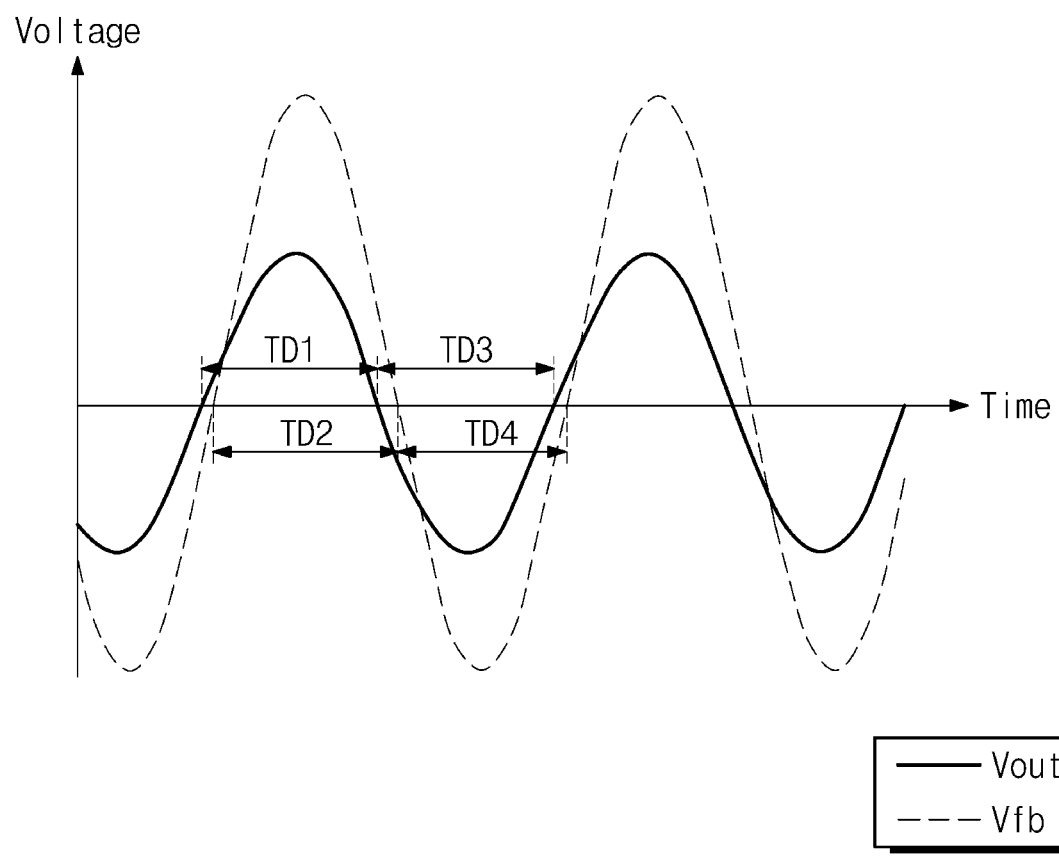
FIG. 3 is a graph showing voltages output from a resonant circuit and an oscillation circuit of FIG. 1.

FIG. 3 is graph showing the voltages output from the resonant circuit and the push-pull oscillation circuit of FIG. 1. In the example of FIG. 3, an x-axis denotes a time, and a y-axis denotes a voltage.

Referring to FIG. 3, the level of the voltage Vout may have a positive value in a time period TD1. The level of the voltage Vfb may have a positive value in a time period TD2. The voltage Vfb in the time period TD2 may correspond to the voltage Vout in the time period TD1. For example, the voltage Vfb in the time period TD2 may be formed as the voltage Vout in the time period TD1 is fed back.

The level of the voltage Vfb may have a negative value in a time period TD3. The level of the voltage Vout may have a negative value in a time period TD4. The voltage Vfb in the time period TD4 may correspond to the voltage Vout in the time period TD3. For example, the voltage Vfb in the time period TD4 may be formed as the voltage Vout in the time period TD3 is fed back. For example, the voltage Vfb in the time period TD4 may be formed as the voltage Vout is fed back in the time period TD3.

As described with reference to FIG. 2, the level of the voltage Vout may correspond to the sum of the level of the voltage Vout1 and the level of the voltage Vout2. For example, the level of the voltage Vout1 may correspond to the level of the voltage Vout changed by the push operation of the oscillator 100, and the level of the voltage Vout2 may correspond to the level of the voltage Vout changed by the pull operation of the oscillator 100. The operations of the oscillator 100 for outputting the voltage Vout in the time period TD1 may correspond to the operations of the oscillator 100a for outputting the voltage Vout1, and the operations of the oscillator 100 for outputting the voltage Vout in the time period TD3 may correspond to the operations of the oscillator 100b for outputting the voltage Vout2.

Figure 4:
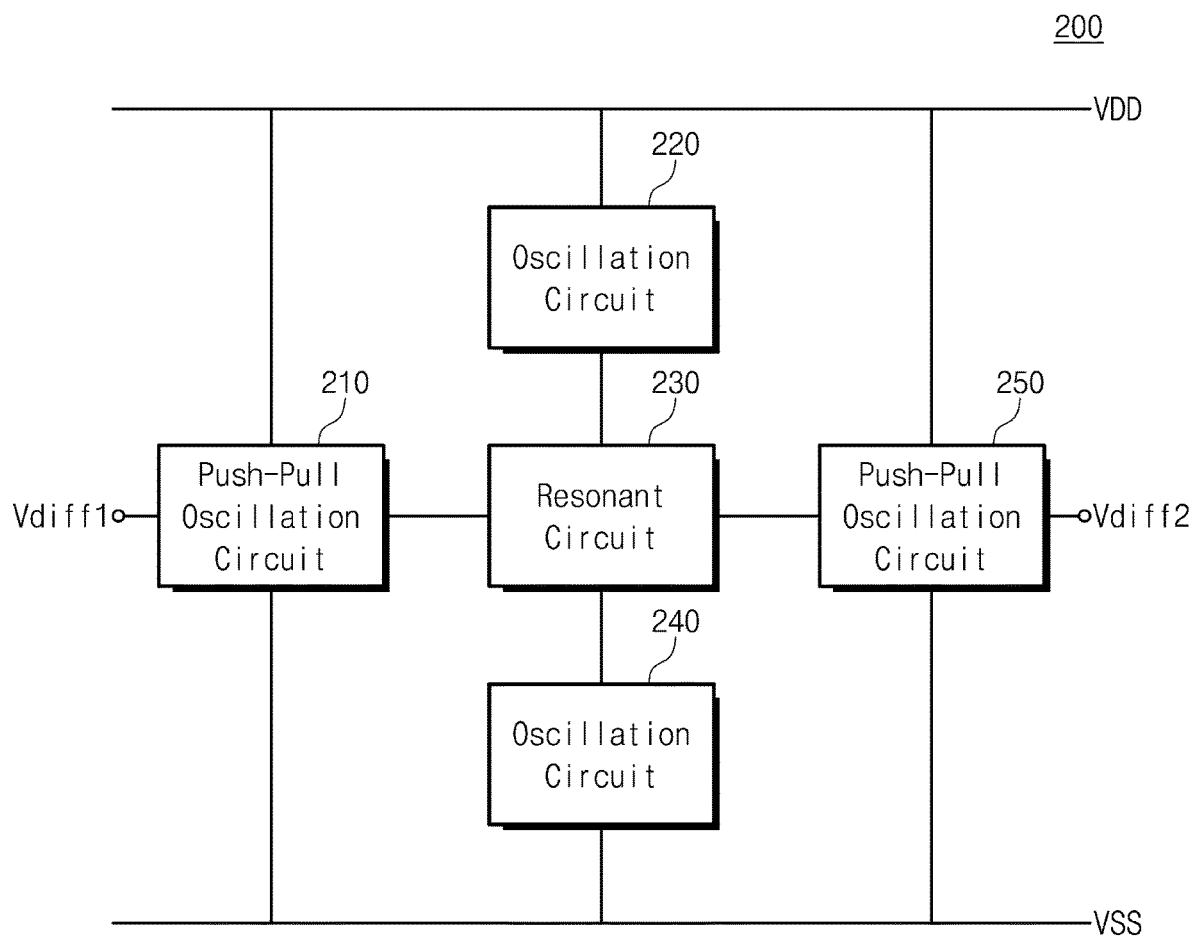
FIG. 4 is a block diagram showing an example configuration of the oscillator of FIG. 1 including the resonant circuit and the oscillation circuit.

FIG. 4 is a block diagram for showing an example configuration of an oscillator including the push-pull oscillation circuit and the resonant circuit of FIG. 1.

Referring to FIG. 4, an oscillator 200 may include push-pull oscillation circuits 210 and 250, oscillation circuits 220 and 240, a resonant circuit 230. Each of the push-pull oscillation circuits 210 and 250 of FIG. 4 may include the push-pull oscillation circuit 120 of FIG. 1. The resonant circuit 230 of FIG. 4 may include the resonant circuit 110 of FIG. 1.

The resonant circuit 230 may output a voltage having a resonance frequency. The push-pull oscillation circuit 210 may output a voltage Vdiff1 based on a voltage output from the resonant circuit 230. The push-pull oscillation circuit 250 may output a voltage Vdiff2 based on a voltage output from the resonant circuit 230. Configurations and operations of the push-pull oscillation circuits 210 and 250 may be similar to those of the push-pull oscillation circuit 120 of FIG. 1, and thus repetitive descriptions may be omitted hereinafter.

Figure 5A:
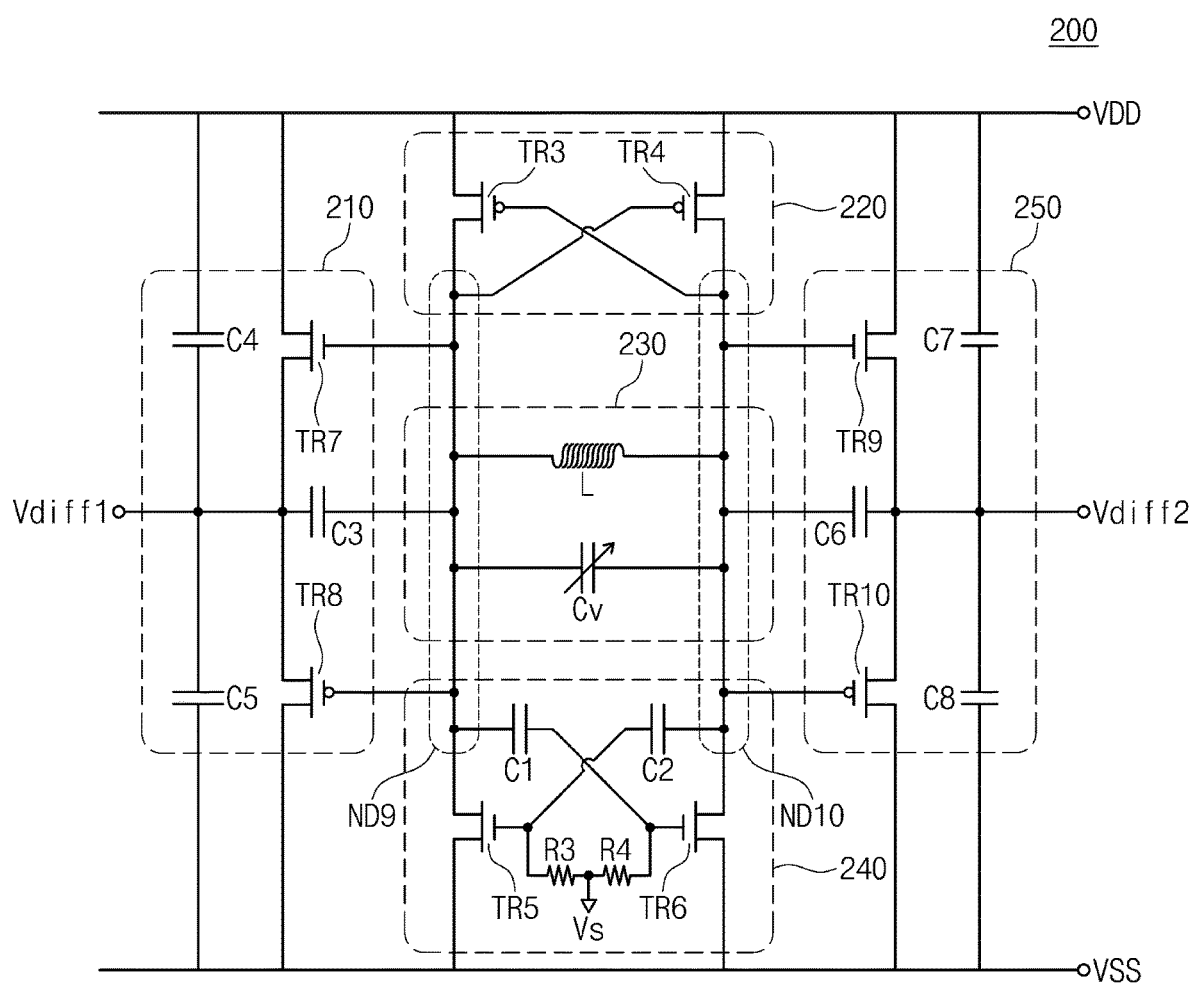
FIG. 5A is a circuit diagram showing an example implementation of the oscillator of FIG. 4.

The oscillation circuit 220 may start up an operation of the oscillator 200. The oscillation circuit 220 may include at least one among oscillation circuits of various types. For example, the oscillation circuit 220 may include a class-B oscillation circuit. The oscillation circuit 240 may adjust swings of the voltages Vdiff1 and Vdiff2 output from the oscillator 200. The push-pull oscillation circuits 210 and 250 may operate as buffers between circuits outside the oscillator 200 and the oscillation circuits 220 and 240 and the resonant circuit. With reference to FIG. 5a, an example implementation and the operations of the oscillator 200 will be described in more detail.

As described with reference to FIGS. 1 and 2, the push-pull oscillation circuits 210 and 250 may respectively have large negative resistances. The push-pull oscillation circuit 210 is connected between the output terminal of the voltage Vdiff1 and the resonant circuit 230, and the push-pull oscillation circuit 250 is connected between the output terminal of the voltage Vdiff2 and the resonant circuit 250. And thus the maximum values of frequencies, which the push-pull oscillation voltages Vdiff1 and Vdiff2 may have, may become large.

FIG. 5a is a circuit diagram showing an example implementation of the oscillator of FIG. 4.

With reference to FIGS. 5 and 1, the push-pull oscillation circuit 210 may include transistors TR7 and TR8, the push-pull oscillation circuit 250 may include transistors TR9 and TR10. Each of the transistors TR7 and TR9 may correspond to the transistor TR1, and each of the transistors TR8 and TR10 may correspond to the transistor TR2. Comparing the oscillator 200 of FIG. 5a with the oscillator 100 of FIG. 1, the push-pull oscillation circuit 210 may include a capacitor C3 corresponding to the feedback circuit 121, a capacitor C4 corresponding to the feedback circuit 122, and a capacitor C5 corresponding to the feedback circuit 123. The push-pull oscillation circuit 250 may include a capacitor C6 corresponding to the feedback circuit 121, a capacitor C7 corresponding to the feedback circuit 122, and a capacitor C8 corresponding to the feedback circuit 123.

The push-pull oscillation circuit 210 may output the voltage Vdiff1 based on a voltage formed at a node ND9. The push-pull oscillation circuit 250 may output the voltage Vdiff2 based on a voltage formed at a node ND10. The voltages Vdiff1 and Vdiff2 may be used as differential inputs in another element (e.g., a mixer) of an electronic device including the oscillator 200.

The oscillation circuit 220 may include cross-coupled transistors TR3 and TR4. The transistor TR3 may be connected between the VDD voltage supply terminal and the node ND9. The transistor ND4 may be connected between the VDD voltage supply terminal and the node ND10. A gate terminal of the transistor TR3 may be connected to the node ND10. A gate terminal of the transistor TR4 may be connected to the node ND9. Each of the transistors TR3 and TR4 may be a p-type MOSFET. The transistors TR3 and TR4 may operate as a class-B oscillation circuit.

The oscillation circuit 240 may include cross-coupled transistors TR5 and TR6, resistors R3 and R4, and capacitors C1 and C2. The resistors R3 and R4 may be connected in series between the gate terminals of the transistors TR5 and TR6. A Vs voltage supply terminal may be connected to a node between the resistors R3 and R4. The capacitor C1 may be connected between the node ND9 and the gate terminal of the transistor TR6. The capacitor C2 may be connected between the node ND10 and the gate terminal of the transistor TR5. The transistors TR5 and TR6, the capacitors C1 and C2, and the resistors R1 and R2 may operate as a class-C oscillation circuit.

Voltage levels of the gate terminals of the transistors TR5 and TR6 may be changed according to the level of the voltage Vs. As to be described with reference to FIG. 6, a swing width of the voltage of the node ND9 may be determined based on the level of a current flowing through the transistor TR5, and a swing width of a voltage of the node ND10 may be determined based on the level of a current flowing through the transistor TR6.

The level of the current flowing through the transistor TR5 may be determined based on the level of the voltage of the gate terminal of the transistor TR5, and the level of the current flowing through the transistor TR6 may be determined based on a voltage level of the gate terminal of the transistor TR6. Since the gate terminal of the transistor TR5 is connected to the Vs voltage supply terminal through the resistor R3, the voltage of the gate terminal of the transistor TR5 may be provided based on the voltage Vs. Since the gate terminal of the transistor TR6 is connected to the Vs voltage supply terminal through the resistor R4, the voltage of the gate terminal of the transistor TR6 may be provided based on the voltage Vs.

For example, the voltage Vs may be supplied from a power supply outside the oscillator 200. The level of the voltage Vs may be determined by an external electronic circuit (e.g., internal/external elements of an electronic device including the oscillator 200) of the oscillator 200 and/or a designer. The external electronic circuit of the oscillator 200 or the designer may adjust the level of the voltage Vs to control the swing widths of the voltages output to the nodes ND9 and ND10. Since the voltages Vdiff1 and Vdiff2 are output based on the voltages output to the nodes ND9 and ND10, the external electronic circuit of the oscillator 200 or the designer may control the swing widths of the voltages Vdiff1 and Vdiff2.

The resonant circuit 230 may include an inductor L and a variable capacitor Cv connected in parallel. The resonant circuit 230 may output voltages having specific frequencies to the nodes ND9 and ND10, respectively. For example, the frequencies of the voltages output to the nodes ND9 and ND10 may correspond to a resonance frequency determined based on the capacitance of the variable capacitor Cv and the inductance of the inductor L. Accordingly, the frequencies of the voltages output to the nodes ND9 and ND10 may be changed according to a change in the capacitance of the variable capacitor Cv.

The capacitance of the variable capacitor Cv may be set by the external electronic circuit of the oscillator 200 and/or the designer. Accordingly, the external electronic circuit of the oscillator 200 and/or the designer may set the capacitance of the variable capacitor Cv to control the frequencies of the voltages output to the nodes ND9 and ND10.

Figure 5B:
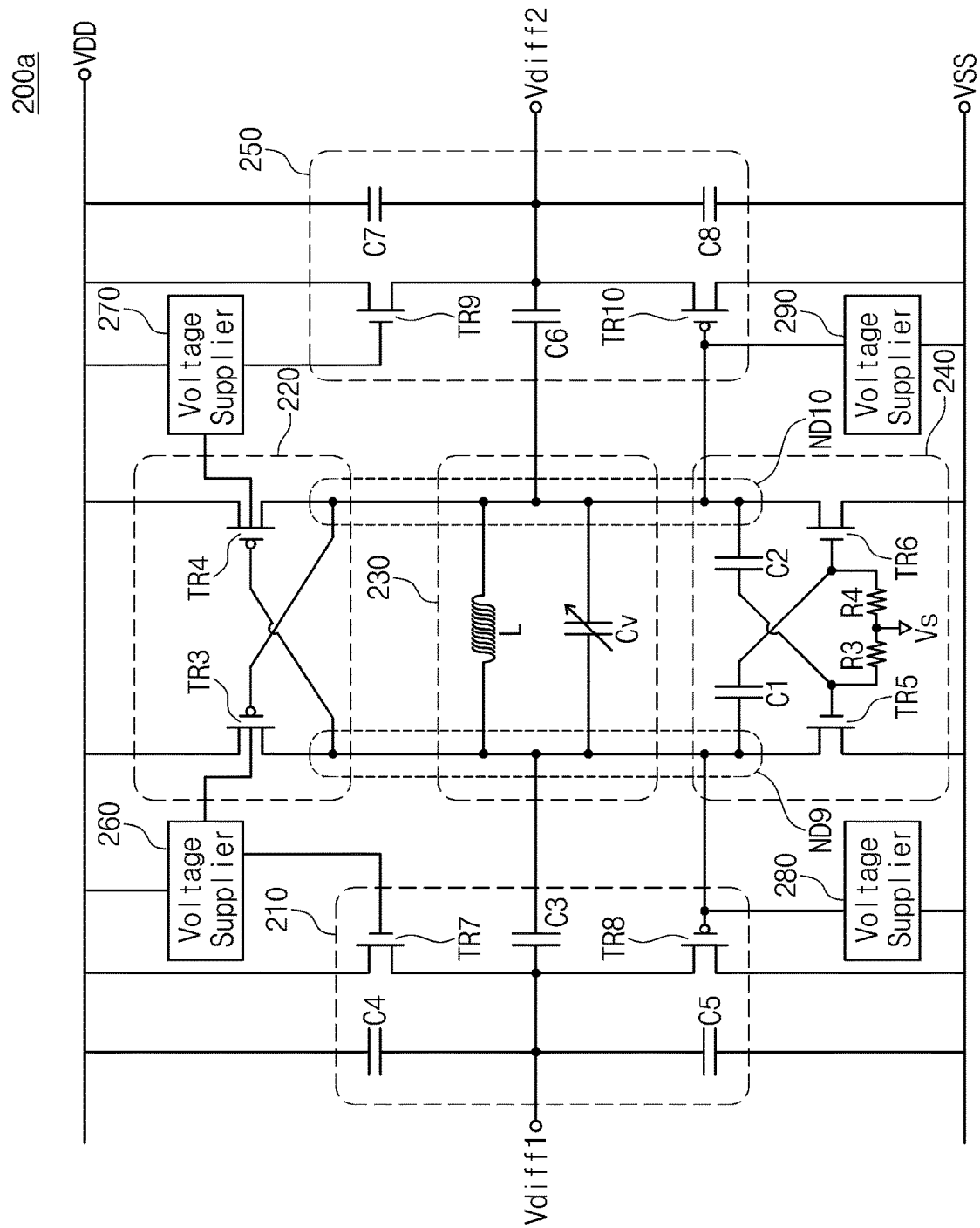
FIG. 5B is another circuit diagram showing an example implementation of the oscillator of FIG. 4 with voltage suppliers.

FIG. 5b is another circuit diagram showing an example implementation of the oscillator 200a having voltage suppliers. The voltage suppliers 260, 270, 280 and 290 may be connected to the transistors TR3, TR4, TR5, TR6, TR7, TR8, TR9, and TR10, respectively. The voltage suppliers 260, 270, 280 and 290 may supply voltages to the transistors TR3, TR4, TR5, TR6, TR7, TR8, TR9 and TR10, respectively. The voltages may have various voltage levels. The voltage suppliers 260, 270, 280 and 290 may adjust the levels of the voltages in order to adjust the current flowing through the transistors TR3, TR4, TR5, TR6, TR7, TR8, TR9, and TR10. The negative resistance value and the resonance frequency may be adjusted according to the bias voltage output from the voltage suppliers 260, 270, 280 and 290. Specifically, the negative resistance may be $V_{diff2}/V_{diff1}$.

In FIG. 5b, The voltage suppliers 260 and 270 may be connected to the back gates of the transistors TR3 and TR4, respectively. The voltage suppliers 260, 270, 280 and 290 may be connected to the gate of the transistors TR7, TR9, TR8 and TR10, respectively. The voltage suppliers 280 and 290 may be connected to the drain of the transistors TR5 and TR6, respectively. The connection configuration of the transistors TR3, TR4, TR5, TR6, TR7, TR8, TR9, TR10 and the voltage suppliers 260, 270, 280, 290 is not limited to that show in FIG. 5B. The voltage suppliers 260, 270, 280 and 290 may be connected to the transistors TR3, TR4, TR5, TR6, TR7, TR8, TR9, and TR10 in a variety ways to adjust the negative resistance value and the resonance frequency.

With reference to FIGS. 1 and 5b, the push-pull oscillation circuit 210 may include transistors TR7 and TR8, the push-pull oscillation circuit 250 may include transistors TR9 and TR10. Each of the transistors TR7 and TR9 may correspond to the transistor TR1, and each of the transistors TR8 and TR10 may correspond to the transistor TR2. Comparing the oscillator 200 of FIG. 5a with the oscillator 100 of FIG. 1, the push-pull oscillation circuit 210 may include a capacitor C3 corresponding to the feedback circuit 121, a capacitor C4 corresponding to the feedback circuit 122, and a capacitor C5 corresponding to the feedback circuit 123. The push-pull oscillation circuit 250 may include a capacitor C6 corresponding to the feedback circuit 121, a capacitor C7 corresponding to the feedback circuit 122, and a capacitor C8 corresponding to the feedback circuit 123. The gate of TR7 is connected to bias and the back gate of TR3, and the gate of TR9 connected to bias and the back gate of TR4. The gate of TR8 is connected to bias and the drain of TR5, and the gate of TR10 connected to bias and the drain of TR6.

Figure 5C:
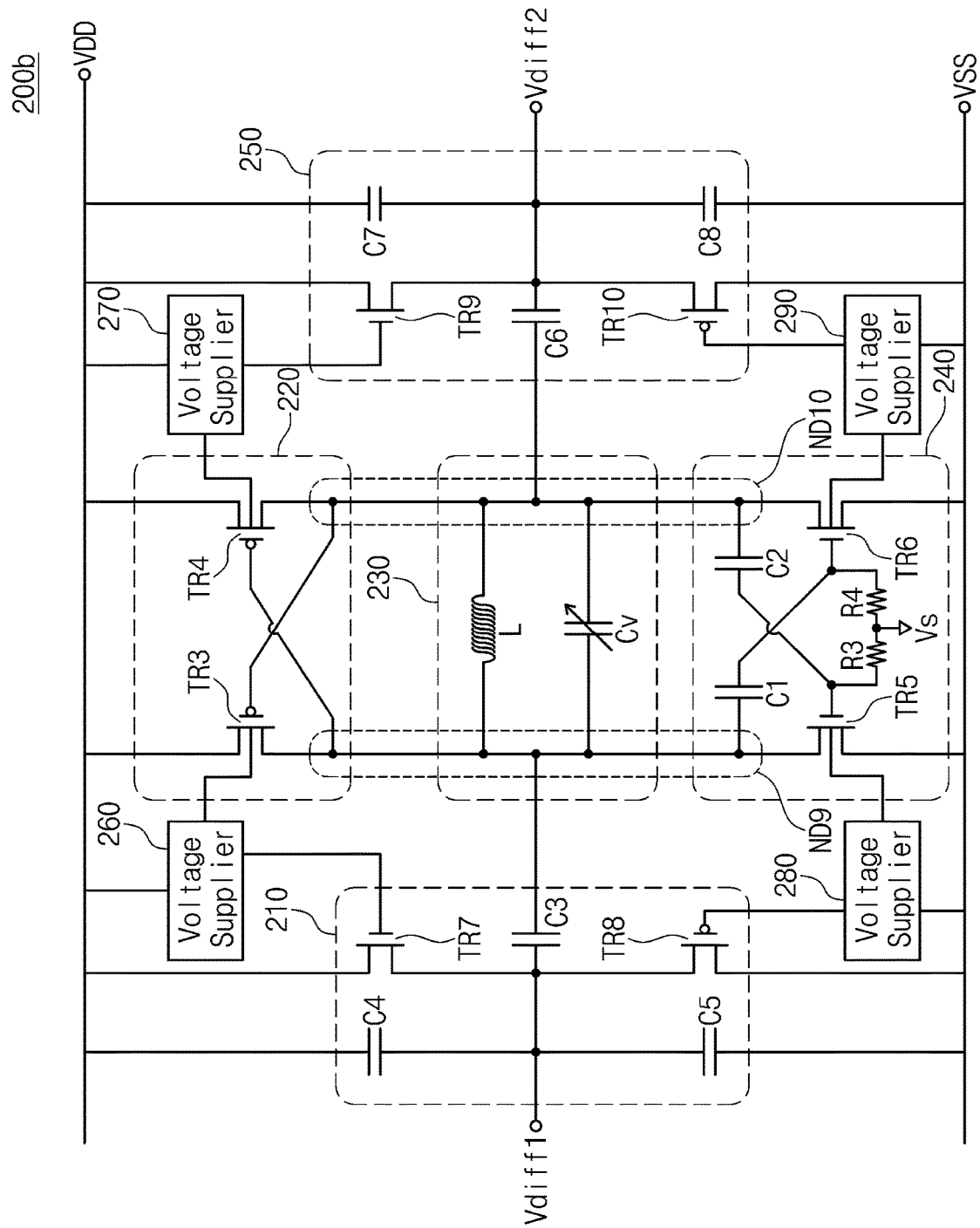
FIG. 5C is another circuit diagram showing an example implementation of the oscillator of FIG. 4 with voltage suppliers.

FIG. 5c is a circuit diagram showing an example implementation of the oscillator 200b having voltage suppliers. The voltage suppliers 260, 270, 280 and 290 may be connected to the back gates of the transistors TR3, TR4, TR5 and TR6, respectively. The voltage suppliers 260, 270, 280 and 290 may supply bias voltages to the transistors TR3, TR4, TR5 and TR6, TR7, TR8, TR9, TR10, respectively.

With reference to FIGS. 1 and 5c, the push-pull oscillation circuit 210 may include transistors TR7 and TR8, the push-pull oscillation circuit 250 may include transistors TR9 and TR10. Each of the transistors TR7 and TR9 may correspond to the transistor TR1, and each of the transistors TR8 and TR10 may correspond to the transistor TR2. Comparing the oscillator 200 of FIG. 5c with the oscillator 100 of FIG. 1, the push-pull oscillation circuit 210 may include a capacitor C3 corresponding to the feedback circuit 121, a capacitor C4 corresponding to the feedback circuit 122, and a capacitor C5 corresponding to the feedback circuit 123. The push-pull oscillation circuit 250 may include a capacitor C6 corresponding to the feedback circuit 121, a capacitor C7 corresponding to the feedback circuit 122, and a capacitor C8 corresponding to the feedback circuit 123. The gate of TR7 is connected to bias and the back gate of TR3, and the gate of TR9 connected to bias and the back gate of TR4. The gate of TR8 is connected to bias and the back gate of TR5, and the gate of TR10 connected to bias and the back gate of TR6.

Figure 5D:
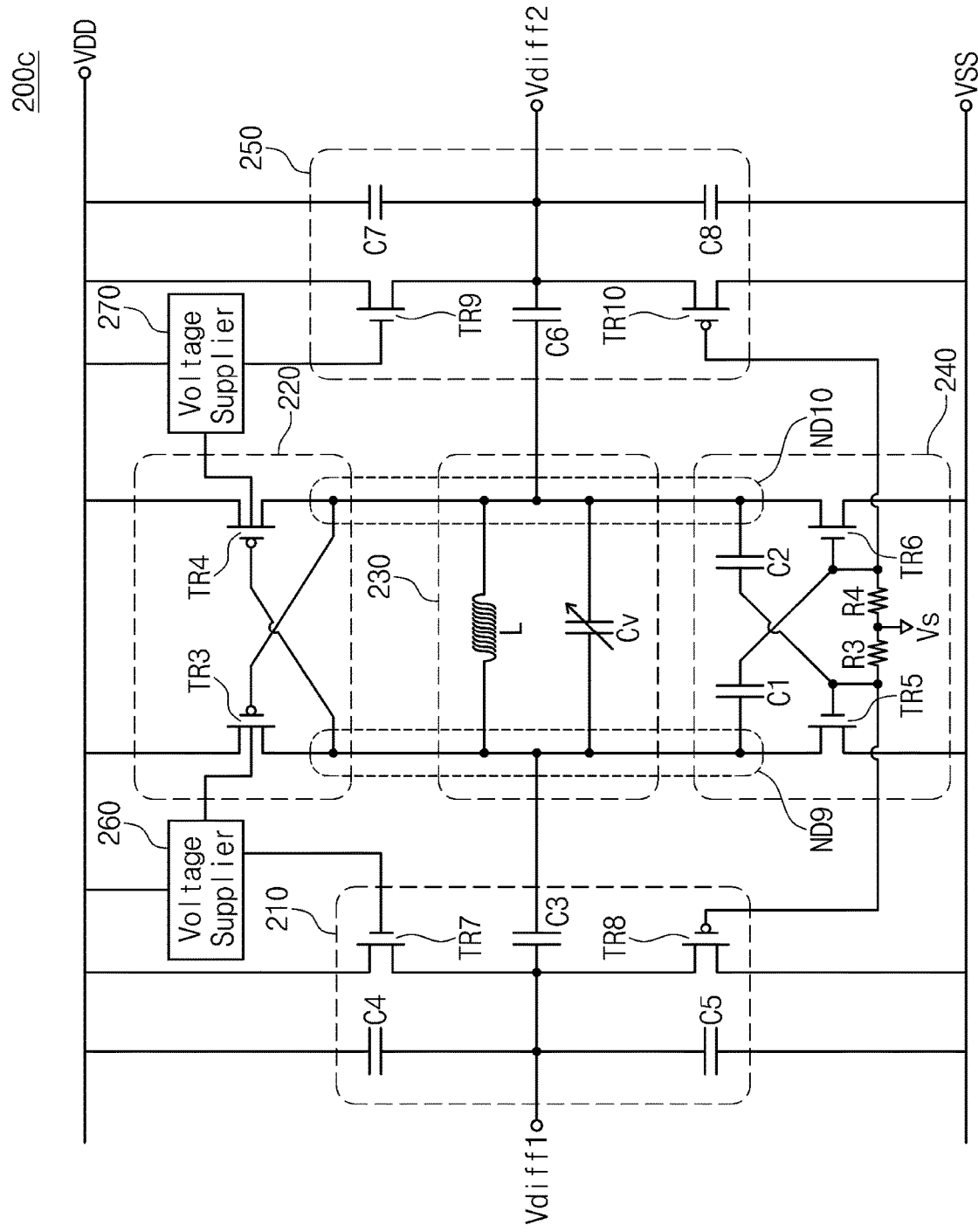
FIG. 5D is another circuit diagram showing an example implementation of the oscillator of FIG. 4 with voltage suppliers.

FIG. 5d is a circuit diagram showing an example implementation of the oscillator 200c having voltage suppliers. The voltage suppliers 260 and 270 may be connected to the back gates of the transistors TR3 and TR4, respectively. The voltage suppliers 260 and 270 may supply vias voltages to the transistors TR3 and TR4, respectively.

With reference to FIGS. 1 and 5d, the push-pull oscillation circuit 210 may include transistors TR7 and TR8, the push-pull oscillation circuit 250 may include transistors TR9 and TR10. Each of the transistors TR7 and TR9 may correspond to the transistor TR1, and each of the transistors TR8 and TR10 may correspond to the transistor TR2. Comparing the oscillator 200 of FIG. 5d with the oscillator 100 of FIG. 1, the push-pull oscillation circuit 210 may include a capacitor C3 corresponding to the feedback circuit 121, a capacitor C4 corresponding to the feedback circuit 122, and a capacitor C5 corresponding to the feedback circuit 123. The push-pull oscillation circuit 250 may include a capacitor C6 corresponding to the feedback circuit 121, a capacitor C7 corresponding to the feedback circuit 122, and a capacitor C8 corresponding to the feedback circuit 123. The gate of TR7 is connected to bias and the back gate of TR3, and the gate of TR9 connected to bias and the back gate of TR4. The gate of TR8 is connected to the gate of TR5, and the gate of TR10 connected to the gate of TR6.

Figure 5E:
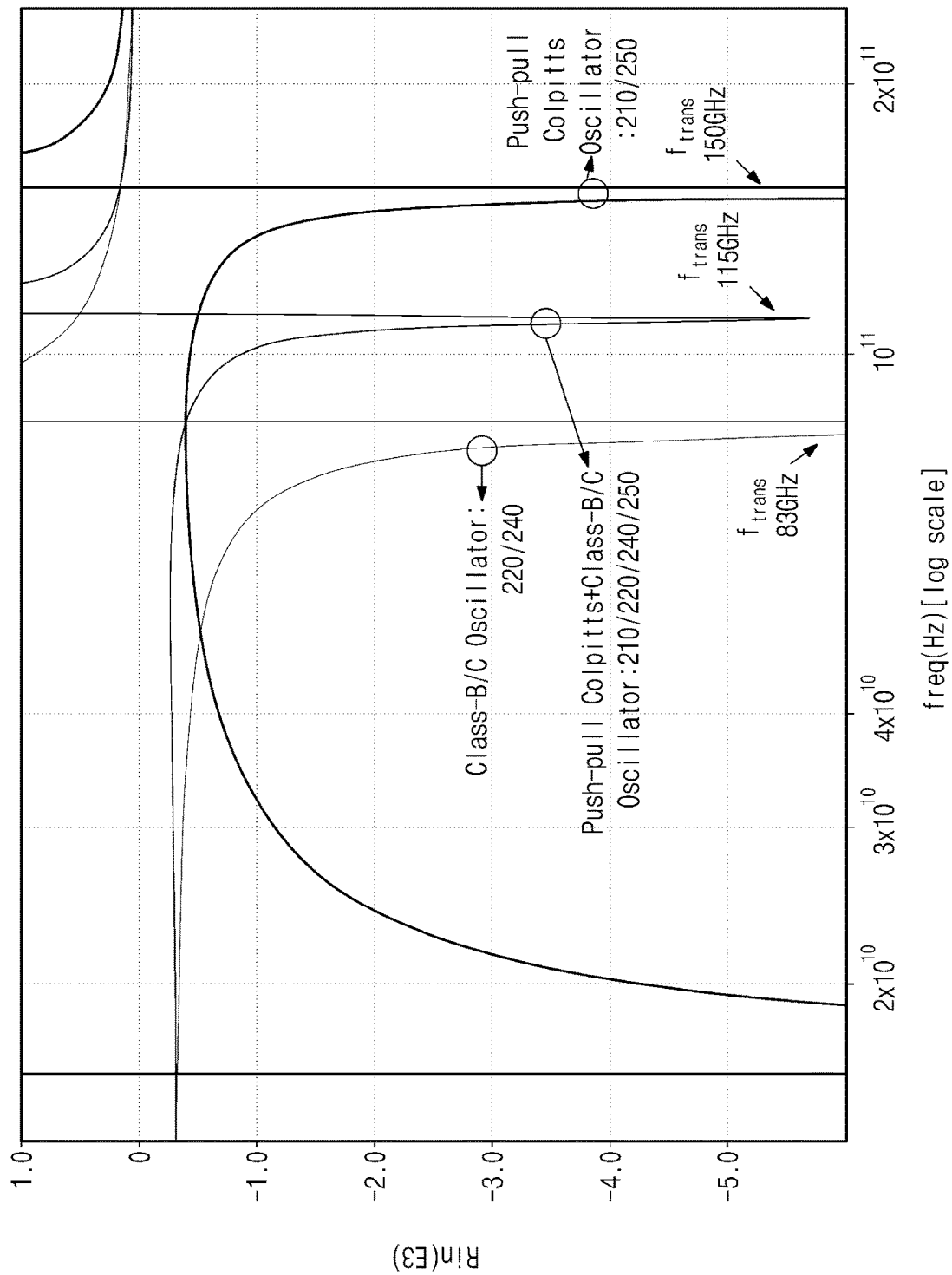
FIG. 5E is a graph showing the value of negative resistances of the oscillators in FIG. 5b.

FIG. 5e is a graph showing the simulated negative resistance curves (−Rin) of the class-B/C oscillator 220 and 240 in FIG. 5b, the push-pull Colpitts oscillator 210 and 250 in FIG. 5b, and the push-pull Colpiltts-based class-B/C oscillator 200 in FIG. 5b. The push-pull Colpitts oscillator represents the highest maximum oscillation frequency (ftrans) of 150 GHz among the three oscillators. The simulation manifests that the ftrans of the push-pull-Colpitts-based class-B/C oscillator of FIG. 5 (115 GHz) is enhanced by adding the push-pull Colpitts oscillator to the typical class-B/C oscillator (83 GHz).

Figure 6:
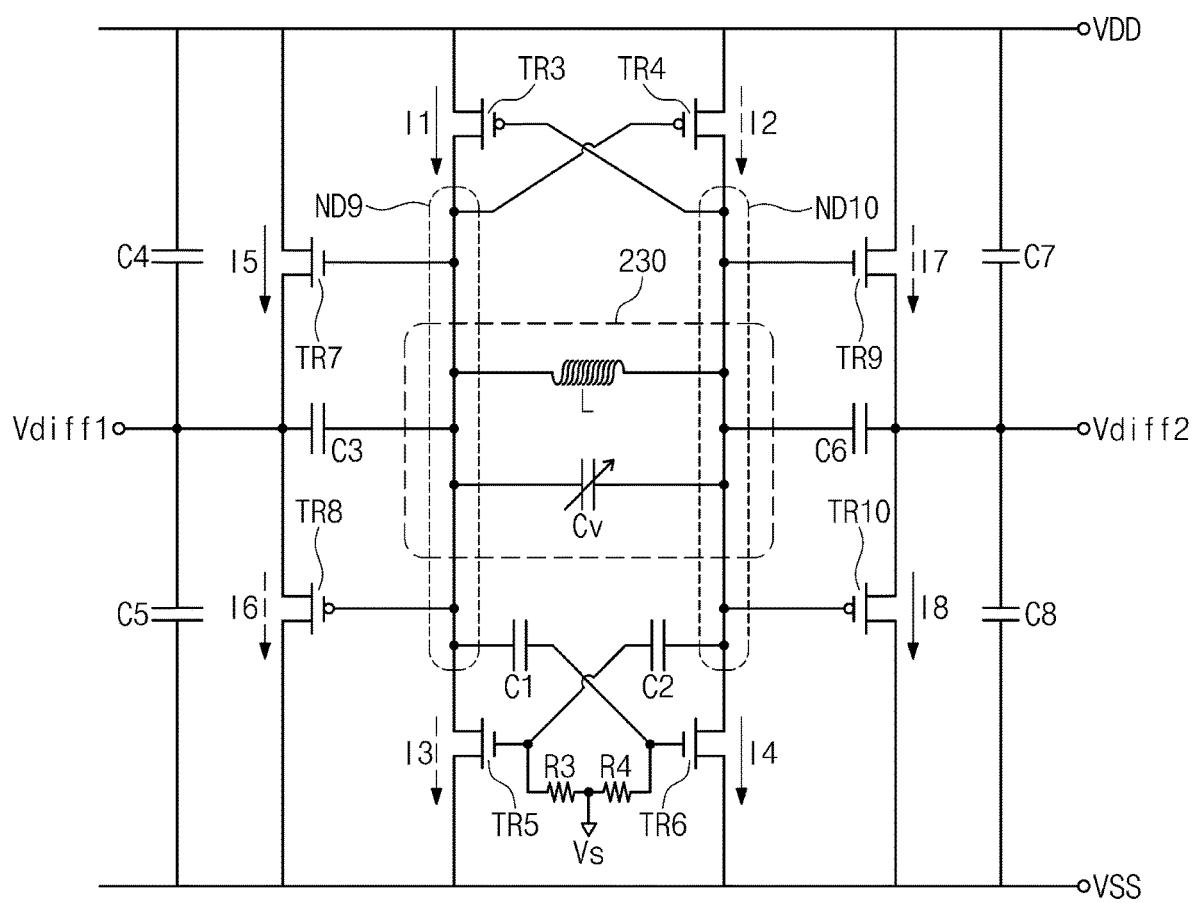

FIG. 6 is a circuit diagram showing an example operation of the oscillator of FIG. 5a.

In a first operation of FIG. 6, a current I1 may flow through the transistor TR3, and a current I4 may flow through the transistor TR6. As the currents I1 and I4 flow, the resonant circuit 230 may output voltages having a resonance frequency to the nodes ND9 and ND10, respectively.

The capacitor C3 may feed the voltage of the node ND9 back to a node between the transistor TR7 and the transistor TR8. The transistor TR7 may deliver a current I5 based on the voltage formed at the node ND9 and the voltage VDD. The voltage Vdiff1 may be formed based on the current I5. For example, as the current I5 flows, the level of the voltage Vdiff1 may be 0 or greater (a push operation). The voltage Vdiff1 may be output as a first differential output from the oscillator 200.

The capacitor C6 may feed the voltage of the node ND10 back to a node between the transistor TR9 and the transistor TR10. The transistor TR9 may deliver a current I8 based on the voltage formed at the node ND10 and the voltage VDD. The voltage Vdiff2 may be formed based on the current I8. For example, as the current I8 flows, the level of the voltage Vdiff2 may be 0 or smaller (a pull operation). The voltage Vdiff2 may be output as a second differential output from the oscillator 200.

In a second operation of FIG. 6, a current I2 may flow through the transistor TR4, and a current I3 may flow through the transistor TR5. As the currents I2 and I3 flow, the resonant circuit 230 may output voltages having the resonance frequency to the nodes ND9 and ND10, respectively.

The capacitor C3 may feed the voltage of the node ND9 back to a node between the transistor TR7 and the transistor TR8. The transistor TR8 may deliver a current I6 based on the voltage formed at the node ND9 and the voltage VDD. The voltage Vdiff1 may be formed based on the current I6. For example, as the current I8 flows, the level of the voltage Vdiff1 may be 0 or smaller (a pull operation). The voltage Vdiff1 may be output as the first differential output from the oscillator 300.

The capacitor C6 may feed the voltage of the node ND10 back to a node between the transistor TR9 and the transistor TR10. The transistor TR9 may deliver a current I7 based on the voltage formed at the node ND10 and the ground voltage. The voltage Vdiff2 may be formed based on the current I7. For example, as the current I7 flows, the level of the voltage Vdiff2 may be 0 or greater (a push operation). The voltage Vdiff2 may be output as the second differential output from the oscillator 200.

Figure 7:
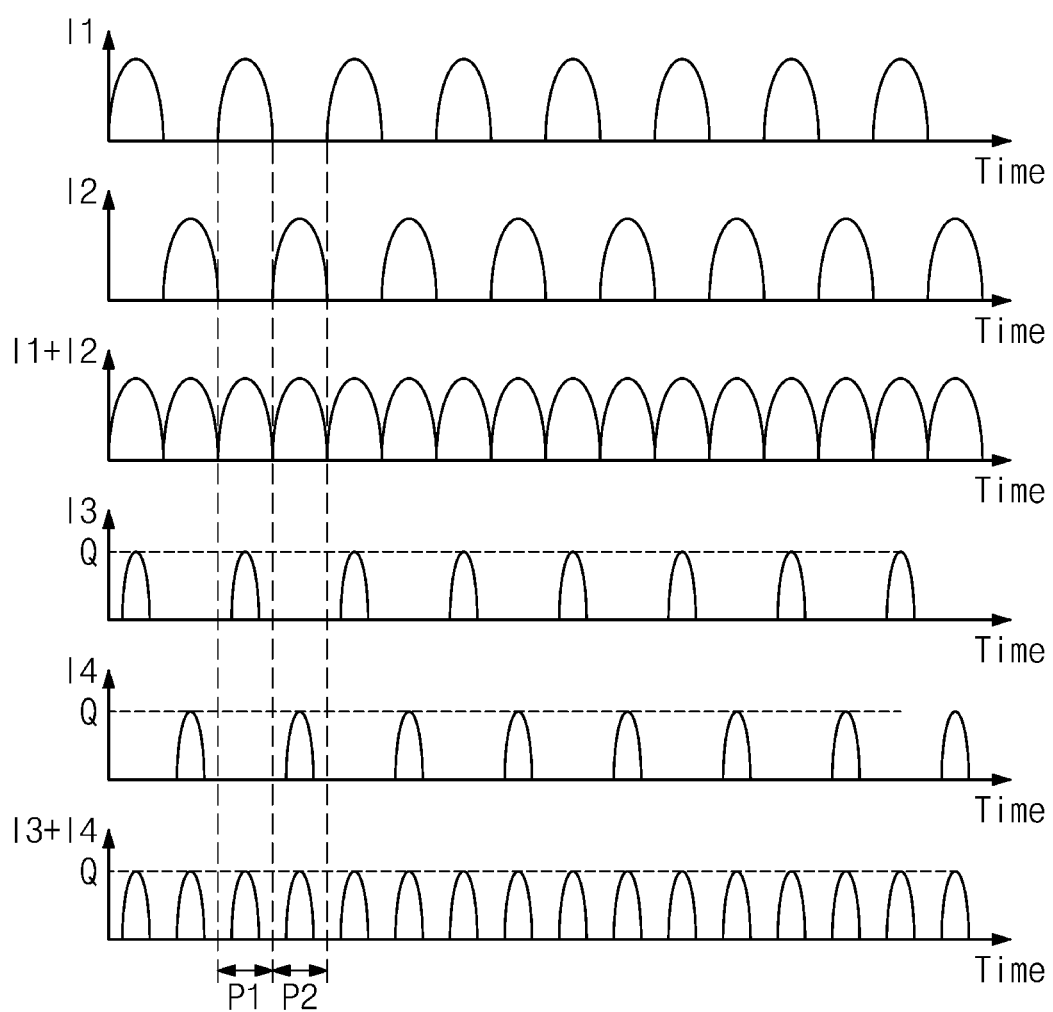
FIG. 7 is a graph showing example currents inside the oscillator of FIG. 6.

The first and second operations may be sequentially performed. As the first and second operations are sequentially performed, the push and pull operations of the push-pull oscillation circuits 210 and 250 may be sequentially performed. As the push and pull operations of the push-pull oscillation circuits 210 and 250 are sequentially performed, the levels of the voltages Vdiff1 and Vdiff2 may have complementary values. With reference to FIG. 7, the currents I1 to I8 in the oscillator 200, which are generated in the first and second operations, and the voltages Vdiff1 and Vdiff2 output from the oscillator 200 will be described in more detail.

FIG. 7 is a graph showing example currents inside the oscillator of FIG. 6. In the example of FIG. 7, an x-axis denotes a time, and a y-axis denotes the levels of currents.

The currents I1 and I2 may sequentially and repetitively flow due to the voltages (i.e., voltages oscillating at the resonance frequency of the nodes ND9 and ND10) output from the resonant circuit 230. For example, the current I1 may flow through the transistor TR3 during a time period P1, and the current I2 may flow through the transistor TR4 after a time period P2. After the time period P2, the oscillator 200 may repetitively perform similar operations. Accordingly, the oscillation circuit 220 of FIG. 5a may periodically and repetitively output the currents I1 and I2.

Referring to a graph illustrating the sum of the level of the current I1 and the level of the current I2, when the length of the time period P1 is substantially identical to the length of the time period P2, the sum of the current I1 and the current I2 may have the length of the time period P1 (or the length of the time period P2) as a cycle.

The current I3 and the current I4 may sequentially flow due to a voltage output from the resonant circuit 230 (i.e., voltages resonating at the resonant frequency at nodes ND9 and ND10). For example, the current I3 may flow through the transistor TR5 in the time period P1, and then the current I4 may flow through the transistor TR6 in the time period P2. After the time period P2, the oscillator 200 may repetitively perform similar operations. Accordingly, the oscillation circuit 240 of FIG. 5a may periodically and repetitively output the currents I3 and I4.

Referring to a graph showing the sum of the level of the current I3 and the level of the current I4, when the length of the time period P1 is substantially identical to the length of the time period P2, the sum of the current I3 and the current I4 may have the length of the time period P1 (or the length of the time period P2) as a cycle.

The level of the current I1 may be equal to or greater than a reference value during the time period P1, and the level of the current I2 may be equal to or greater than the reference value during the time period P2. For example, the level of the current I1 may be equal to or greater than 0 during the time period P1, and the level of the current I2 may be equal to or greater than 0 during the time period P2. Accordingly, the sum of the level of the current I1 and the level of the current I2 may be continuously 0 or greater in the time domain shown in the graph. In other words, the oscillation circuit 220 may continuously output the current I1 or I2 having the level of 0 or greater in the time domain shown in the graph.

Accordingly, even when the voltage VDD is applied to the oscillation circuit 220 at an arbitrary time, the oscillation circuit 220 of FIG. 5a, which includes the class-B oscillation circuit, may output the current I1 or I2 having the level of 0 or greater in response to the voltage VDD. Accordingly, the class-B oscillation circuit may be suitable as the implementation of the oscillation circuit 220 configured to start up the operation of the oscillator 200.

A time period in which the level of the current I3 is the reference value may be included in the time period P1, and a time period in which the level of the current I4 is the reference value may be included in the time period P2. For example, a time period in which the level of the current I3 is 0 may be included in the time period P1, and a time period in which the level of the current I4 is 0 may be included in the time period P2. The currents I3 and I4 output from the oscillation circuit 240 may have the level of 0 or greater during a time length shorter than that of the currents I1 and I2 output from the oscillation circuit 220. Accordingly, the power consumed by the oscillation circuit 240 may be less than that consumed by the oscillation circuit 220.

The currents I3 and the current I4 may have the peak value Q. As described with reference to FIGS. 5 and 6, the current I3 and the current I4 may be generated by the oscillation circuit 240, and the levels of the current I3 and the current I4 may be determined based on the level of the voltage Vs. As described with reference to FIG. 5a, the level of the voltage Vs may be adjusted by an external electronic circuit of the oscillator 200 or the designer. The peak value Q of the current I3 and the current I4 may be determined based on the level of the voltage Vs. Accordingly, if necessary, the oscillation circuit 240 of FIG. 5a including the class-C oscillation circuit may output the currents I3 and I4 having the peak value Q.

Since the levels of the voltages Vdiff1 and Vdiff2 may respectively vary based on the levels of the currents I3 and I4, the oscillation circuit 240 may control swing widths of the voltages Vdiff1 and Vdiff2 based on the level of the voltage Vs. Accordingly, the class-C oscillation circuit may be suitable for implementing the oscillation circuit 240 configured to control the swing widths of the voltages Vdiff1 and Vdiff2.

Since the currents I1 and I2 and the levels of the currents I3 and I4 vary based on the voltages of the nodes ND9 and ND10 having the levels varying according to the resonance frequency of the resonant circuit 230, each cycle (or each frequency) of the currents I1 and I2, the currents I3 and I4, the sum of the currents I1 and I2, and the sum of the currents I3 and I4 may be related to the resonance frequency of the resonant circuit 230.

Figure 8:
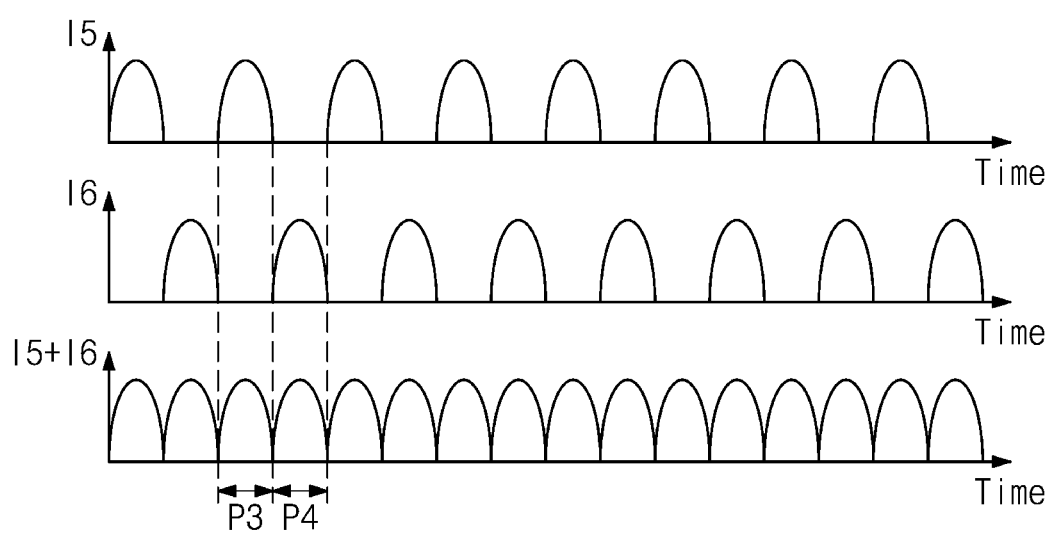
FIG. 8 is a graph showing example currents inside the oscillator of FIG. 6.

FIG. 8 is a graph showing example currents inside the oscillator of FIG. 6. In the example of FIG. 8, an x-axis may denote a time, and a y-axis may denote the levels of currents.

As described with reference to FIG. 7, the currents I1 and I2 may sequentially and repetitively flow through the transistors TR3 and TR4. As the currents I1 and I2 sequentially and repetitively flow, the currents I5 and I7 may flow through the transistors TR7 and TR9.

Since the current I1 and I2 flow in a specific cycle, the currents I5 and I6 may also flow in the specific cycle. For example, the current I5 flows through the transistor TR7 during the time period P3, and the current I7 may flow through the transistor TR9 during the time period P4. Each of the levels of the currents I5 and I6 may vary in a cycle of the sum of the length of the time period P3 and the length of the time period P4.

As described with reference to FIG. 6, the current I5 may flow according to a first operation of the push-pull oscillation circuit 210, and the current I6 may flow according to a second operation of the push-pull oscillation circuit 210. As the first and second operations of the push-pull oscillation circuit 210 are sequentially performed, the sum of the levels of the current I5 and the current I6 may periodically vary. For example, when the length of the time period P3 is substantially the same as the length of the time period P4, the sum of the levels of the current I5 and the current I6 may vary in a cycle of the length of the time period P5 (or the length of the time period P6).

Since the currents I5 and I6 flow based on the voltages of the nodes ND9 and ND10 having the resonant frequency of the resonant circuit 230, each cycle (or frequency) of the current I5, the current I6, or the sum of the current I5 and the current I6 may be related to the resonance frequency of the resonant circuit 230.

Since the current I8 flows through the transistor TR10 according to the first operation, the change in the current I8 may be similar to that in the current I5. Since the current I7 flows through the transistor TR9 according to the second operation, the change in the current I7 may be similar to that in the current I6. Accordingly, descriptions about the currents I8 and I7 will be omitted.

Figure 9:
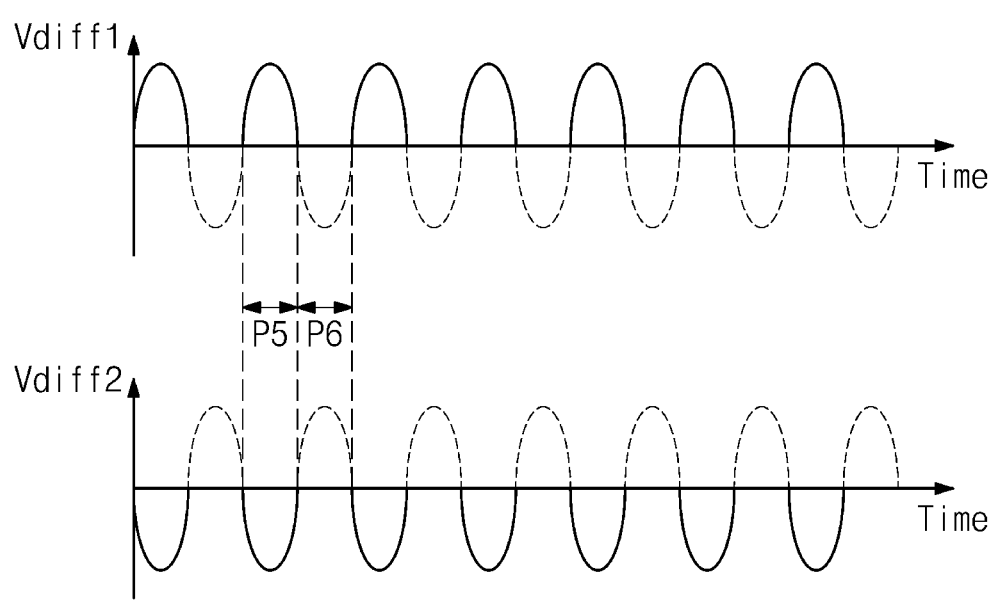
FIG. 9 is a graph showing example voltages output from the oscillator of FIG. 6.

FIG. 9 is a graph showing example voltages output from the oscillator of FIG. 6. In the example of FIG. 9, an x-axis may denote a time, and a y-axis may denote the levels of the voltages Vdiff1 and Vdiff2, respectively. In the example of FIG. 9, a graph shown in a solid line denotes the levels of the voltages Vdiff1 and Vdiff2 output by the first operation of FIG. 6, and a graph shown in a dashed line denotes the levels of the voltages Vdiff1 and Vdiff2 output by the second operation of FIG. 6.

In the time period P5, the first operation of the oscillator 200 may be performed. Accordingly, in the time period P5, the level of the voltage Vdiff1 may be changed according to the current I5 delivered through the transistor TR7 (a push operation). In time period P5, the level of the voltage Vdiff2 may be changed according to the current I8 delivered through the transistor TR10 (a pull operation). For example, referring to FIGS. 8 and 9, the level of the voltage Vdiff1 in the time period P5 may vary based on the level of the current I5 in the time period P3, and the level of the voltage Vdiff2 in the time period P5 may vary based on the level of the current I8 in the time period P3.

In the time period P6, the second operation of the oscillator 200 may be performed. Accordingly, in the time period P6, the level of the voltage Vdiff1 may be changed according to the current I6 delivered through the transistor TR8 (a pull operation). In time period P6, the level of the voltage Vdiff2 may be changed according to the current I7 delivered through the transistor TR9 (a push operation). For example, referring to FIGS. 8 and 9, the level of the voltage Vdiff1 in the time period P6 may vary based on the level of the current I6 in the time period P4, and the level of the voltage Vdiff2 in the time period P6 may vary based on the level of the current I7 in the time period P4.

As described with reference to FIG. 6, the voltage Vdiff1 may be output based on the voltage of the node ND9 by the transistors TR7 and TR8, and the voltage Vdiff2 may be output based on the voltage of the node ND10 by the transistors TR9 and TR10. Accordingly, the levels of the voltages Vdiff1 and Vdiff2 may respectively vary based on the voltages of the nodes ND9 and ND10.

For example, referring to FIGS. 7 and 9, the voltage Vdiff1 in the time period P5 may be output based on the voltage of the node ND9 in the time period P1, and the voltage Vdiff1 in the time period P6 may be output based on the voltage of the node ND9 in the time period P2. For example, the voltage Vdiff2 in the time period P5 is output based on the voltage of the node ND10 in the time period P1, and the voltage Vdiff2 in the time period P6 may be output based on the voltage of the node ND10 in the time period P2.

The levels of the voltages Vdiff1 and Vdiff2 of FIG. 9 may be similar to the level of the voltage Vout in FIG. 3. For example, the level of the voltage Vout during the time period TD1 may correspond to the level of the voltage Vdiff1 during the time period P5. The level of the voltage Vout during the time period TD3 may correspond to the level of the voltage Vdiff1 during the time period P6. The level of the voltage Vout during the time period TD1 may correspond to the level of the voltage Vdiff2 during the time period P6. The level of the voltage Vout during the time period TD3 may correspond to the level of the voltage Vdiff2 during the time period P5.

The push-pull oscillation circuits 210 and 250 may sequentially and repetitively perform the first operation and the second operation to respectively output the voltages Vdiff1 and Vdiff2. The first operation and the second operation may be performed based on the voltages and the currents generated based on the resonance frequency of the resonant circuit 230. Accordingly, the levels of the voltages Vdiff1 and Vdiff2 may periodically vary based on a frequency corresponding to the resonance frequency. In the example of FIG. 9, the levels of the voltages Vdiff1 and Vdiff2 may have the sum of the length of the time period P5 and the length of the time period P6 as a cycle. The sum of the length of the time period P5 and the length of the time period P6 may be related to the resonance frequency of the resonant circuit 230.

FIG. 10 is a block diagram illustrating an example configuration of an electronic device including the oscillator of FIG. 1.

The electronic device 1000 may include a communication block 1100, a user interface 1200, a nonvolatile memory 1300, a buffer memory 1400, a power manager 1500, and a main processor 1600. However, the elements of the electronic device 1000 are not limited to the embodiment of FIG. 10. The electronic device 1000 may not include one or more among the elements shown in FIG. 10, or may further include at least one element that is not shown in FIG. 10.

The communication block 1100 may include an antenna 1110, a transmitter/receiver 1120, and a modulator/demodulator (MODEM) 1130. The communication block 1100 may exchange a signal with an external device/system through the antenna 1110. For example, the transmitter/receiver 1120 may include a mixer configured to mix voltages of various frequencies. In addition, the transmitter/receiver 1120 may include an oscillator configured to provide a voltage of a specific frequency. For example, the transmitter/receiver may include at least one of the oscillator 100 of FIG. 1 and the oscillator 200 of FIG. 4 in order to provide a voltage of a specific frequency to the mixer.

For example, the transmitter/receiver 1120 and the MODEM 1130 of the communication block 1100 may process the signal exchanged with the external device/system according to the wireless communication protocol such as Long Term Evolution (LTE), Worldwide Interoperability for Microwave Access (WIMAX), Global System for Mobile communication (GSM), Code Division Multiple Access (CDMA), Bluetooth, Near Field Communication (NFC), Wireless Fidelity (Wi-Fi), and the like.

The user interface 1200 may mediate communication between a user and the electronic device 1000. For example, the user may input a command to the electronic device 1000 through the user interface 1200. For example, the electronic device 1000 may provide information generated by the main processor 1600 to the user through the user interface 1200.

The nonvolatile memory 1300 may store data regardless of power supply. For example, the nonvolatile memory 1300 may include at least one of various nonvolatile memories such as a flash memory, PRAM, MRAM, ReRAM, FRAM, or the like. For example, the nonvolatile memory 1300 may include a detachable memory such as a Hard Disk Drive (HDD), a Solid State Drive (SSD), a Secure Digital (SD) card, and/or an embedded memory such as an Embedded Multimedia Card (eMMC).

The buffer memory 1400 may store data to be used in operation of the electronic device 1000. For example, the buffer memory 1400 may temporarily store data processed or to be processed by the main processor 1600. For example, the buffer memory 1400 may include a volatile memory such as a Static Random Access Memory (SRAM), Dynamic RAM (DRAM), or Synchronous DRAM (SDRAM), or a nonvolatile memory such as a, Phase-change RAM (PRAM), Magneto-resistive RAM (MRAM), Resistive RAM (ReRAM), or Ferro-electric RAM (FRAM).

The power manager 1500 may provide power to the elements of the electronic device 1000. For example, the power manager 1500 may suitably convert power received from a battery and/or an external power supply, and deliver the converted power to the elements of the electronic device 1000.

The main processor 1600 may control the entire operations of the electronic device 1000. The main processor 1600 may control operations of the elements of the electronic device 1000. The main processor 1600 may process various calculations for operating the electronic device 1000. For example, the main processor 1600 may process various calculations based on signals received from the communication block 1100, the user interface 1200, or the like. For example, the main processor 1600 may be implemented with a general-purpose processor, a dedicated processor, or an application processor.

According to the embodiments of the inventive concept, an electronic device having a higher negative resistance, and an oscillator including the same may be provided.

The above-described is detailed embodiments for practicing the present inventive concept. The present disclosure includes not only the above-described embodiments but also simply changed or easily modified embodiments. In addition, the present inventive concept also include techniques easily modified and practiced using the embodiments of the present disclosure. Therefore, the scope of the present disclosure is not limited to the described embodiments but is defined by the claims and their equivalents.

What is claimed is:

1. An electronic circuit comprising:
a resonant circuit configured to output a resonance voltage to a first node, the resonance voltage having a resonance frequency; and
an oscillation circuit configured to output an oscillation voltage based on the resonance voltage received from the first node, the oscillation voltage having a level changing depending on a first current and a second current,
wherein
the first current is delivered between a first voltage supply terminal and a second node in a first time period,
a first feedback circuit is connected between the first node and the second node,
the second current is delivered between the second node and a second voltage supply terminal in a second time period, and
a sum of a length of the first time period and a length of the second time period corresponds to the resonance frequency;
wherein the oscillation circuit comprises:
a first transistor configured to deliver the first current from the first voltage supply terminal to the second node; and
a second transistor configured to deliver the second current from the second node to the second voltage supply terminal; and
wherein
the first feedback circuit is configured to feed the oscillation voltage back to the first node, and the oscillation circuit further comprises:
a second feedback circuit configured to feed the oscillation voltage back to one terminal of the first transistor through the first voltage supply terminal; and
a third feedback circuit configured to feed the oscillation voltage back to one terminal of the second transistor through the second voltage supply terminal.

2. The electronic device of claim 1, wherein the first transistor is further configured to deliver the first current in response to a level equal to or greater than a first reference value of the resonance voltage, and
the second transistor is further configured to deliver the second current in response to a level equal to or smaller than a second reference value of the resonance voltage.

3. The electronic device of claim 1, wherein the first feedback circuit, the second feedback circuit, and the third feedback circuit comprise capacitive elements configured to feed back the oscillation voltage.

4. The electronic device of claim 3, wherein a magnitude of a resistance with respect to a direction toward the first node from the resonant circuit is determined based on capacitances of the capacitive elements.

5. The electronic device of claim 1, wherein the resonant circuit comprises a variable capacitive element having a varying capacitance, and
the resonance frequency varies based on the varying capacitance.

6. An oscillator comprising:
a resonant circuit configured to:
output a first resonance voltage having a resonance frequency to a first node, and
output a second resonance voltage having the resonance frequency to a second node;
a first oscillation circuit configured to:
receive a first current through a third node in a first time period,
output a second current through the third node in a second time period, and
output a first oscillation voltage to the third node based on the first resonance voltage received from the first node;
a second oscillation circuit configured to:
output a third current through a fourth node in the first time period,
receive a fourth current through the fourth node in the second time period, and
output the second oscillation voltage to the fourth node based on the second resonance voltage received from the second node,
a third oscillation circuit configured to:
deliver a fifth current between a first voltage supply terminal and the first node in a third time period, and deliver a sixth current between the first voltage supply terminal and the second node in a fourth time period; and
a fourth oscillation circuit configured to:
deliver a seventh current between the first node and the second voltage supply terminal in the fourth time period, and deliver an eighth current between the second node and the second voltage supply terminal in the third time period;
wherein, in the first time period and the second time period, a level of the first oscillation voltage varies based on the first current and the second current, and a level of the second oscillation voltage varies based on the third current and the fourth current;
wherein the third oscillation circuit comprises:
a first transistor configured to deliver the fifth current between the first voltage supply terminal and the first node; and
a second transistor configured to deliver the sixth current between the first voltage supply terminal and the second node;

wherein a gate terminal of the first transistor is connected to the second node, and a gate terminal of the second transistor is connected to the first node; and
wherein the oscillator further comprises:
a first voltage supplier configured to adjust a level of a voltage supplied to a back gate of the first transistor; and
a second voltage supplier configured to adjust a level of a voltage supplied to a back gate of the second transistor.

7. The oscillator of claim 6, wherein a sum of a length of the third time period and a length of the fourth time period corresponds to the resonance frequency.

8. The oscillator of claim 6, wherein, in the third time period, a level of the first resonance voltage varies based on the fifth current, and a level of the second resonance voltage varies based on the eighth current, and
in the fourth time period, the level of the first resonance voltage varies based on the seventh current, and the level of the second resonance voltage varies based on the sixth current.

9. The oscillator of claim 8, wherein the level of the first oscillation voltage in the first time period varies based on the level of the first resonance voltage in the third time period, and
the level of the first oscillation voltage in the second time period varies based on the level of the first resonance voltage in the fourth time period.

10. The oscillator of claim 6, wherein in order to adjust a level of the first current received to the third node, the first voltage supplier configured to adjust a level of a voltage supplied to the first oscillation circuit, and
in order to adjust a level of the fourth current received to the fourth node, the second voltage supplier configured to adjust a level of a voltage supplied to the second oscillation circuit.

11. The oscillator of claim 6, wherein the fourth oscillation circuit comprises:
a third transistor configured to deliver the seventh current between the node and the second voltage supply terminal;
a fourth transistor configured to deliver the eighth current between the second node and the second voltage supply terminal; and
first and a second resistors connected in parallel between a gate terminal of the third transistor and a gate terminal of the fourth transistor.

12. The oscillator of claim 11, wherein the oscillator further comprises:
a third voltage supplier configured to adjust a level of a voltage supplied to a back gate of the third transistor; and
a fourth voltage supplier configured to adjust a level of a voltage supplied to a back gate of the fourth transistor.

13. The oscillator of claim 12, wherein in order to adjust a level of the second current output from the third node, the third voltage supplier configured to adjust a level of a voltage supplied to the first oscillation circuit, and
in order to adjust a level of the third current output from the fourth node, the fourth voltage supplier configured to adjust a level of a voltage supplied to the second oscillation circuit.

14. The oscillator of claim 11, wherein the fourth oscillation circuit is configured to receive a control voltage through a node between the first resistor and the second resistor, and a swing width of the first oscillation voltage and a swing width of the second oscillation voltage are adjusted based on the control voltage.

15. The oscillator of claim 6, wherein the resonant circuit comprises a variable capacitive element configured to connect the first node with the second node, and having a varying capacitance, and the resonance frequency varies based on the varying capacitance.

* * * * *